Figure 1:
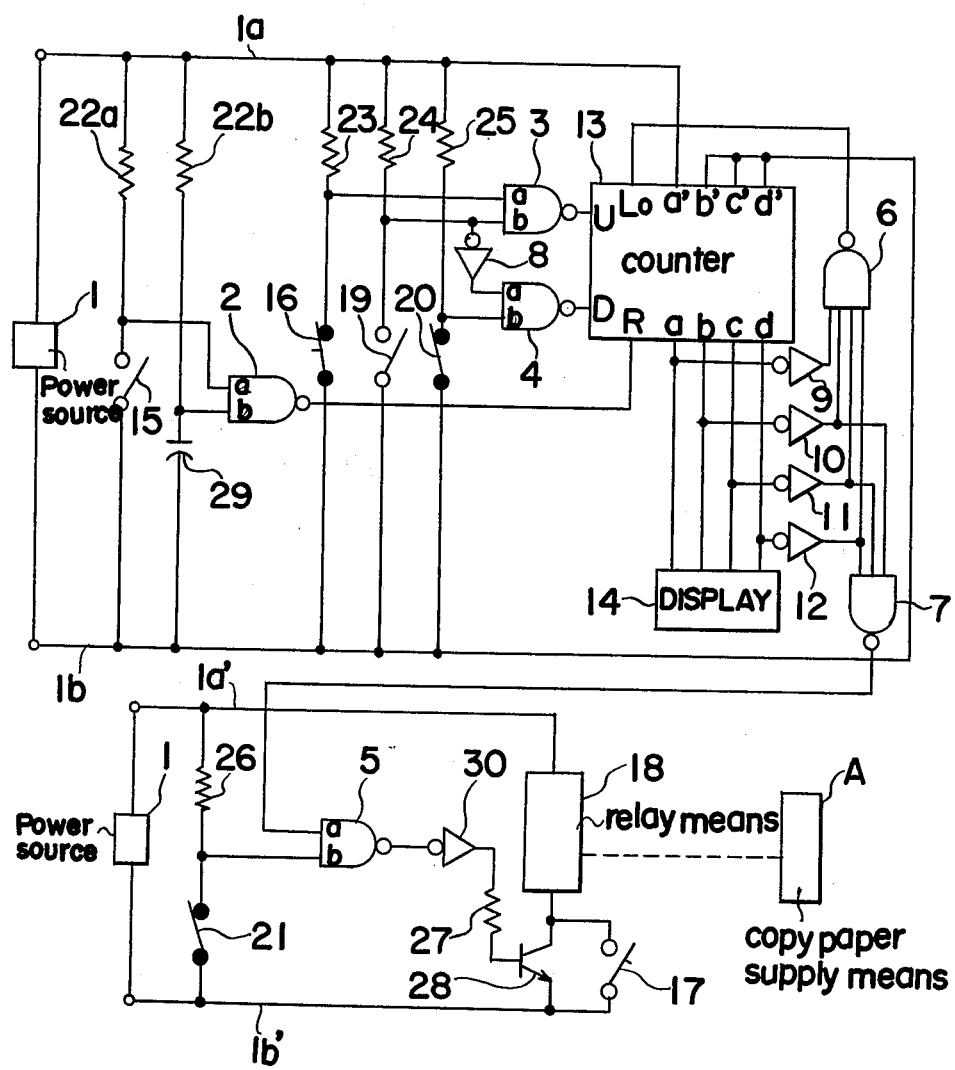

United States Patent [19]

Murata et al.

[11] 4,105,914
[45] Aug. 8, 1978

[54] PRESETTING COUNTER DEVICE

[75] Inventors: Tomoji Murata, Toyokawa; Kenji Shibazaki, Aichi; Yoshihiro Nakamura; Matsuo Kuse, both of Toyokawa, all of Japan

[73] Assignee: Minolta Camera Kabushiki Kaisha, Osaka, Japan

[21] Appl. No.: 808,773

[22] Filed: Jun. 21, 1977

Related U.S. Application Data

[63] Continuation of Ser. No. 669,452, Mar. 22, 1976, abandoned.

[30] Foreign Application Priority Data

Apr. 1, 1975 [JP] Japan ................... 50/44291

[51] Int. Cl.² ..................... G06B 27/06; G06M 3/04
[52] U.S. Cl. ..................... 235/92 SB; 235/92 EV; 235/92 MS; 235/92 R; 355/14
[58] Field of Search ........ 235/92 SB, 92 CT, 92 PE, 235/92 FP, 92 EV, 92 MS; 328/48; 355/14

[56] References Cited

U.S. PATENT DOCUMENTS

| | | | |
|---|---|---|---|
| 3,413,452 | 11/1968 | Schlein | 235/92 PE |
| 3,758,755 | 9/1973 | Sames | 235/92 SB |
| 3,800,253 | 3/1974 | Bryant | 235/92 SB |
| 3,846,624 | 11/1974 | Kawanabe | 235/92 FP |
| 3,886,329 | 5/1975 | Kamiyama | 235/92 PE |
| 3,917,928 | 11/1975 | Wesner | 235/92 EU |

*Primary Examiner*—Joseph M. Thesz

[57] ABSTRACT

Presetting counter device for control of single or repeated actuation of a piece of equipment permits stopping of equipment action during continuous repeat action thereof if required, and always resets a display means for an indication of the number of times the device is required to be actuated to "1" when the equipment is thus stopped and after single or repeated actuation of the equipment, whereby manual resetting action by a user is unnecessary. As the device requires manual actuation only of a resetting switch, an initial count means for specifying a required number of actions during actuation of the equipment, and a start switch, equipment control with the device is extremely simple.

12 Claims, 1 Drawing Figure

PRESETTING COUNTER DEVICE

This is a continuation, of application Ser. No. 669,452, filed Mar. 22, 1976, now abandoned.

The present invention relates to a presettable counter device suited for employment in photocopying, counting or other equipment in which it is required to selectively cause action involving movement of an object or objects to be effected once or a plurality of times in succession, and which is simple to actuate.

In many fields it is required to provide a presettable counter device to cause particular actions to be effected a specified number of times. For example, a photocopying machine is required to provide a single copy of an original document or a plurality of copies of the document, and from the point of view of economy of time and convenience of use of the photocopying machine it is desirable that the photocopying machine include a device for specifying the number of copies of a document which are required at a particular time, counting the number of copies obtained, and stopping action of the machine when the required number of copies has been obtained, in order to make it possible to obtain a plurality of copies of a document in continuous succession. To achieve this, in conventional photocopying machine it is known to provide a set number display panel in which, when it is required to obtain two or more copies of the same document, the required number of copies is displayed upon actuation of a setting switch means. After this, it is necessary to set a counter means with which usually another display means is associated to "0", then a print switch is actuated to cause copies of the document to be obtained in continuous succession, during which action the content of the counter means is increased by "1" for each copy obtained, action of the photocopying machine being stopped when the content of the counter means is equal to that of the set number display panel. Although such means has the advantage that action of the device is controlled by electronic means, which are relatively compact and efficient in service, from the point of view of a person using the machine there is the disadvantage that, since at the end of the action of the device the content both of the counter and of the set number display means correspond to the number of copies obtained in the preceding copying action, it is always necessary to reset the counter means to "0" before obtaining a copy or copies of another document, and if it is required to obtain a different number of copies of a document, the set number display means must be reset to "0" and set to the new required number. Thus, the control panel of the photocopying machine must have a somewhat complex construction and actuation thereof must be fastidious. To avoid the necessity of repeated resetting of the setting switch means to "0" when it is required to obtain a single copies of successive documents it is known to further provide for example a changeover switch which may be switched to a setting to cause production of single copies only or to a setting to permit plural-copy production. Such a changeover switch means, however, while facilitating actuation of the machine when a great number of single copies of documents is required, renders the control panel more complex, and offers little advantage when it is required to obtain only a few single copies of documents, then a plurality of copies of a document, then single copies again.

To overcome these disadvantages, it is been known provide a setting and counter device comprising a dial which controls a ratchet wheel and a detent means. When more than two copies of a document are required, the ratchet wheel is turned a requisite number of degrees, until a display means the content of which is changed depending on the setting of the ratchet wheel specifies the required number of copies, after which actuation of a print switch causes actuation of the photocopying machine to obtain the copies, the ratchet wheel being turned back and the content of the display means being reduced by "1" for each copy obtained, until all the required copies have been obtained. With this device, the dial and display means are always set to "1" after each time the photocopying machine has been actuated to obtain a single copy or a plurality of copies of a document and there is therefore the advantage that there is no need for resetting a number setting means to "0", or for actuation of a single copy / plural copy changeover switch. However, the device has the disadvantages that it is less compact than an electronic control means, and that that mechanical construction thereof is complex, and it is more difficult to mount than electronic means.

A further disadvantage in the conventional device is that it is not possible, without complicated control means to reset the photocopying machine during plural copy action. In the mechanical setting and counter device described above, such resetting requires a particularly complicated construction.

It is accordingly a principal object of the invention to provide a presettable counter device requiring only a simple control panel for actuation thereof.

It is a further object of the invention to provide an electronic presettable counter device which is suited to employment in a photocopying machine and is always set to "1" at the end of each action to obtain a required number of copies, and also upon initial connection of the photocopying machine to an electrical power supply.

It is another object of the invention to provide a presettable counter device which may be reset to "1" at any time during action of a photocopying machine, counting or other device in which the means is employed.

In accomplishing these and other objects there is provided, according to the present invention a presettable counter device wherein the content of an up-down counter is increased by actuation of a setting switch means and is decreased as each copy of a document in a photocopying machine, for example, is obtained, output from the up-down counter being supplied to a display unit the content of which is varied in accordance with that of the up-down counter. When a single copy, or the last copy in a series of copies is obtained, the counter content and the display unit content momentarily go to "0", and are then made "1", so that, after each actuation, the photocopying machine is always set ready to obtain a single copy, without any action being required of a user. Even if less than the initially specified number of copies have been obtained, input from a reset switch supplied through a gate means stops action of the photocopying machine after a current copy is obtained, and in this case also the content of the up-down counter and of the display unit are set to "1". A reset input is also passed through the gate means, without actuation of the reset switch being necessary, when power is initially connected to the presetting counter device, whereby the up-down counter and display unit are set to "1" at this time also. The device of the invention requires only a very simple control panel including no more than three switches, a setting switch for specifying two or more copies, a reset switch, and a print switch for commencing photocopying action. For the user, actuation of the device of the invention therefore is very simple, since it is only necessary to actuate the print switch to obtain single copies, and no adjustment or resetting is necessary after either single- or plural-copy actuation of the photocopying machine, but at the same time the means is simple and compact, avoids mechanical problems, and is easy to mount in photocopying or other equipment.

A better understanding of the invention may be had from the following full description of one preferred embodiment thereof when read in reference to the attached drawing, FIG. 1, which is a circuit diagram of a presettable counter device according to the invention.

The description below is with reference to use of the presetting counter device in a photocopying machine of the type such as a document-transferring type or a light-arrangement-moving type, it being understood that the means is equally employable in other equipment, such as counting devices, or repetitive loop system devices in an automated system.

In the means of the invention, a high-level voltage present at the input or output of an element or at a terminal of a counter described below is taken to be logical "1" or binary "1", and a low-level voltage as logical "0" or numerical "0". For the purpose of brevity in the description below, input etc. at a high voltage level will be referred to as "H" input, etc., and low-level voltage input, etc. as "L" input, etc.

Referring to FIG. 1, a suitable electrical power source 1 supplies power via lines 1a and 1b to the means of the invention. Enabling input is carried by line 1a to an input 13a' of an up-down counter 13, and by the line 1b to input terminals 13b', 13c' and 13d' of counter 13. The input terminals 13a', 13b', 13c', and 13d' respectively carry content representative of first, second, third, and fourth place binary digits, and the content thereof may be transferred to and moved out of the up-down counter 13 via corresponding output terminals 13a, 13b, 13c, and 13d. Having a total of four input terminals, and four corresponding output terminals for carrying information in binary notation, the up-down counter 12 can count up to or down from decimal "15."

Output from counter 13 is supplied to a display unit 14, which has a conventional construction and includes, for example, known means such as 7-segment numeric displays, nixie tubes, relevant segments, or cathodes which are actuated by counter 13 output, whereby decimal representation of counter 13 content is shown by display unit 14.

Up-down counter 13 has a conventional construction, such as described in for example, and as well as input terminals 13a' through 13d' and corresponding output terminals 13a through 13d has a count-up input terminal 13U, count-down input terminal 13D, load terminal 13Lo, and reset terminal 13R. Upon application of "H" input at reset terminal 13R the content of up-down counter 13 is cleared to "0", i.e., the value at each of the input terminals 13a' through 13d' and output terminals 13a and through 13d is made "L", regardless of the values of input to the terminals 13U, 13D, and 13Lo. Under the condition that the input to load terminal 13Lo is "H" and the input to reset terminal 13R is "L", counter 13 content is incremented by "1" each time a rising edge of an input signal is supplied to count-up input terminal 13U, and is decremented by "1" when a similar input is applied to count-down input terminal 13D. When the input at reset terminal 13R is "1", in the absence of actuating inut to either count-up terminal 13U or count-down terminal 13D, the content of counter 13 is maintained if the input to load terminal 13Lo is "H".

Counter 13 is also incremented by "1" when a "L" input at load terminal 13Lo coincides with a "L" input at reset terminal 13R. Alternatively the construction of counter 13 may be such that a falling edge of an input signal arriving at load terminal 13R when the input at reset terminal 13R is "L" causes the content of counter 13 to be incremented by "1". As described in greater detail below, the coincidence of an "L" input at reset terminal 13R and load terminal 13Lo always occurs when the counter 13 content has been cleared to "0", and occurs only at this time. The load terminal 13Lo may therefore be considered as a second reset terminal, actuating input to which causes the content of counter 13 to be made "1".

Input to reset terminal 13R, count-up input terminal 13U, count down input terminal 13D, and load terminal 13Lo is supplied from NAND gate 2, NAND gate 3, NAND gate 4, and NAND gate 6, respectively.

NAND gate 2 has two input terminals, 2a and 2b. Terminal 2a connected to power supply line 1a through a voltage-limiting resistor 22a and to power supply line 1b through a normally-open switch 15 which is controlled by a manually actuable push-button, not shown, employed for reset purposes as described in greater detail below. Terminal 2b is connected through a voltage-limiting resistor 22b to line 1a and through a capacitor 29 to line 1b. Upon initial connection of the power supply means 1 an, "H" input is supplied to terminal 2a of NAND gate 2, since reset switch 15 is open at this time, but for a short time, until capacitor 29 is fully charged, input to terminal 2b is "L", and NAND gate 2 output, which is supplied as input to reset terminal 13R of up-down counter 13, is therefore "H". When capacitor 29 becomes fully charged, output at NAND gate input terminal 2b also becomes "H", and NAND gate 2 produces a "L" output. This condition is maintained until reset switch 15 is closed, which results in a "L" input to terminal 2a and consequently a "H" output from NAND gate 2 during the time switch 15 is closed.

NAND gate 3 also is a two-input gate, and has an input terminal 3a which is connected to power supply line 1a through voltage-limiting resistor 23 and to power supply line 1b through a normally-closed setting switch 16, which is controlled by a manually actuable push-button not shown and is employed for setting the number of copies of a document when two or more copies are required. The other input terminal, terminal 3b, of NAND gate 3 receives input via a line 3b' which is connected to line 1a through voltage-limiting resistor 24 and to line 1b through a normally-open switch 19, which is actuable by the document carrier of the photocopying machine, not shown. The document carrier is normally stationary at a loading position, whereat an original document may be loaded thereonto, and is movable in a known manner to carry an original document past scanning means which project the image of the document to suitable copying means, after which the document carrier is returned to the loading position. When it is at the loading position, the document carrier does not contact switch 19, but at all other times, i.e., during movement of the document carrier, actuates switch 19. In other words, switch 19 remains closed, the input to terminal 3b of NAND gate 3 is "L", and NAND gate 3 output supplied as input to count-up terminal 13U of up-down counter 13 is "H" throughout the whole time a copy of an original document is being obtained, regardless of whether switch 16 is actuated or unactuated.

When the document carrier is at the loading station, switch 19 being open, the input to terminal 3b of NAND gate 3 is "H", but while setting switch 16 remain unactuated the input to terminal 3a is "L", and so NAND gate 3 output remains "H". However, if now setting switch 16 is actuated, i.e., opened, input the to terminal 3a also becomes "H" and NAND gate 3 output therefore becomes "L". When setting switch 16 is released, and recloses, input to terminal 3a again becomes "L", NAND gate 3 output again rises to "H", and the rising edge of this output supplied to counter terminal 13U causes counter the content of 13 to be increased by "1", presuming the input to load terminal 13Lo is "H" and the input to reset terminal 13R is "L" as noted above. Thus, when the document carrier is at the loading station, counter 13 content may be incremented by successive "1"s by successive depression and release of setting switch 16.

NAND gate 4 supplying input to count-down terminal 13D of counter 13 has two input terminals, 4a and 4b. Terminal 4a is connected to the output of an inverter 8 having an input connected to the input line 3b' of terminal 3b of NAND gate 3. The input to terminal 4a is therefore "H" during the whole time a copy is being obtained and switch 19 is closed. Terminal 4b is connected through a voltage-limiting resistor 25 to power supply line 1a and through a normally-closed switch 20 to power-supply line 1b. Switch 20 is contactable by the document carrier of the photocopying machine and is actuated thereby for a short time only during each photocopying machine action to obtain one copy of an original document. During this action, therefore, the input to terminal 4a is always "H", but the input to terminal 4b is normally "L", and NAND gate 4 output supplied as the input to counter terminal 13D is normally "H". However, during the short time during which switch 20 is opened by the document carrier, since the input to terminal 4b also becomes "H", NAND gate 4 output becomes "L". As the document carrier continues to move switch 20 is allowed to reclose, whereby the input to terminal 4b again becomes "L" and NAND gate 4 output again becomes "H". The rising edge of this output supplied to the content of counter terminal 13D causes counter 13 to be decremented by "1".

NAND gate 6 supplying input to load input terminal 13Lo of up-down counter 13 has four input terminals which are respectively connected to the output terminals of inverters 9, 10, 11, and 12 whose the input terminals of which are connected to the output terminals 13a, 13b, 13c, and 13d, respectively, of up-down counter 13. Thus, the input to counter load terminal 13Lo from NAND gate 6 is "L" only if voltage level at all of the counter output terminals 13a, 13b, 13c, and 13d is "L", i.e., if the content of up-down counter 13 is "0", and is "H" if the voltage level at any one of the counter output terminals is "H", i.e., when the content counter 13 is "1" or more.

The output terminals of the inverters 10, 11, and 12 also supply input to a NAND gate 7. Since, as noted above, the counter output terminals 13b, 13c, and 13d, to which the inverters 10, 11, and 12 are respectively connected, carry output representative of second, third, and fourth place values in the binary system, i.e., decimal "2", "4" and "8", the output from NAND gate 7 is "L" only when the content of counter 13 is less than decimal "2" and the voltage level at all of the output terminals 13b, 13c and 13d is "L", and is "H" at other times, i.e., when the content of counter 13 is decimal "2" or more, and consequently the voltage at least one of the output terminals is "H".

Output from NAND gate 7 is supplied to one input terminal 5a of a NAND gate 5 which has two input terminals, 5a and 5b, and forms part of a photocopying machine actuation circuit shown in the lower portion of FIG. 1. Power to this circuit is supplied from the same power supply 1, via a circuit comprising power supply lines 1a' and 1b'. Terminal 5b of NAND gate 5 is connected through a voltage limiting resistor 26 to line 1a' and through a normally closed switch 21 to line 1b'.

Switch 21 is actuated for a short time by the document carrier of the photocopying machine once each time the document carrier is moved in order to obtain a copy of an original document, actuation of switch 21 being before the abovementioned switch 20 associated with NAND gate 4.

The output from NAND gate 5 is supplied through an inverter 30 and resistor 27 to the base of an NPN transistor 28 having an emitter connected to power supply line 1b' and a collector connected to one end or terminal of a self-holding relay means 18, the opposite end or terminal of which is connected to power supply line 1a'. A normally open switch 17 which is closeable by a manually actuable push-button means not shown and serves to start photocopying machine action, is provided in parallel with transistor 28 between relay means 18 and line 1b'.

The push-buttons controlling start switch 17 and the abovementioned reset switch 15 and copy number setting switch 16 are all of the instant-return type, i.e., the switches 15, 16, and 17 remain actuated only while their respective push-buttons are held depressed. These push-buttons are provided together with the display unit 14 on the control panel of the photocopying machine, no other control panel elements being required.

Presuming that transistor 28 is not conducting, the power supply circuit to relay means 18 is normally open and the photocopying machine is therefore unactuated. When, however, the push-button controlling switch 17 is depressed, switch 17 is closed, thereby closing the power supply circuit to relay means 18, which is thereupon energized and closes a circuit, now shown, for drive of the document carrier and requisite elements in the photocopying machine, and simultaneously causes actuation of a copy paper supply means which is shown schematically at A in the drawing and causes a sheet of copy paper for receiving a copy of an original document to be moved in a required manner through the photocopying machine. After each actuation of switch 17, relay means 18 remains energized for a sufficient time to permit one copy of a document to be obtained, after which action of the photocopying machine is stopped until the next time switch 17 is closed.

Action relating to transistor 28 is as follows. If the content of counter 13 is less than decimal "2" the input supplied by NAND gate 7 to terminal 5a of NAND gate 5 is "L". NAND gate 5 output is therefore "H", irrespective of the state of switch 21 and input terminal 5b, inverter 30 output is "L", and transistor 28 is not made conductive. In this condition therefore relay means 18 is actuable only by start switch 17 and permits only single-copy action of the photocopying machine.

However, while counter 13 content is decimal "2" or more, at least one of the counter output terminals has a "H" voltage level, and NAND gate 7 input to terminal 5a of NAND gate 5 is therefore "H". Until the photocopying machine is actuated and the document carrier thereof is moved, the input to terminal 5b of NAND gate 5 is "L" and NAND gate 5 output is "H", since switch 21 is unactuated. However, during movement of the document carrier in order to obtain a copy of a document switch 21 is opened temporarily the input to terminal 5b also of NAND gate 5 becomes "H", NAND gate 5 output becomes "L", and inverter 30 supplies a "H" input to the base of transistor 28, which is therefore rendered conductive and maintains closure of the power supply circuit to relay means 18 independently of switch 17. In other words, actuation of the photocopying machine is maintained without it being necessary to actuate start switch 17, the abovedescribed action being repeated as each successive copy of a document is obtained, until the content of counter 13 becomes "1", whereupon NAND gate 7 output becomes "L" and transistor 28 can no longer be made conductive, and switch 17 must then be closed to cause energization of relay means 18.

Inverters 9, 10, and 11 and NAND gate 7 may thus be considered as together constituting an actuation control input means which, when the content of counter 13 is less than "2", decimal supplies to the actuation circuit a first input which prevents conduction of transistor 28 and so only permits single-copy action of the photocopying machine, and when the content of counter 13 is equivalent to decimal "2", or more, supplies a second input which permits conduction of transistor 28, and hence repeated actuation of the photocopying machine.

Overall action of the abovedescribed setting and counter means is as follows.

Prior to connection of power supply source 1, voltage values at all points in the circuit are "0", i.e., equivalent to "L". When power supply source 1 is connected, the content of up-down counter 13 is temporarily indeterminate, but is immediately cleared to "O" since NAND gate 2 supplies "H" input to counter reset terminal 13 while capacitor 29 is being charged. Switches 16 and 19 being unactuated at this time, the input to terminal 3a of NAND gate 3 and terminal 4a of NAND gate 4 is "L", and the input both to count-up terminal 13U and to count-down terminal 13D of counter 13 is "H". The input to load terminal 13Lo is "L" since the content of counter 13 is "O". When capacitor 29 is fully charged, the input to reset terminal from NAND gate 2 becomes "L". The input to load terminal 13Lo also being "L" at this time, the content of counter 13 is changed from "O" to "1", i.e., the voltage level becomes "H" at output terminal 13a of counter 13 and remains "L" at terminals 13b, 13c and 13d, this value is supplied to and displayed by display unit 14, and at the same time the input to load terminal 13Lo becomes "H". The voltage level at counter output terminals being "L", the output from NAND gate 7 is "L", and transistor 28 in the photocopying machine actuation circuit cannot be made conductive. This condition of the circuit elements is maintained until the control panel push-buttons are actuated by a user.

If only one copy of a document is required, since counter 13 and display unit 14 are already set to "1", it is simply necessary to actuate switch 17, in order to energize relay means 18 a sufficient time for one copy to be obtained. During this single copy action of the photocopying-machine, switch 19 is closed, and remains closed until the document carrier returns to the loading position, and switch 20 is opened and then allowed to reclose, with the result that the input supplied by NAND gate 4 to count-down terminal 13D of counter 13 goes from "H" to "L", then to "H" again, and the content of counter 13 is decreased by "1", i.e., goes to "0". Display unit 14 content also goes to "0" momentarily, but when counter 13 content goes to "0", the input to load terminal 13Lo immediately becomes "L", and since the input to reset terminal 13R also is "L", reset switch 15 being unactuated, the content of counter 13 again goes to "1" and the input to load terminal 13Lo again becomes "H". Thus the circuit is again brought to a state ready for production of a single copy of a document, and the display unit 14 again displays "1". Since the change of unit 14 display from "1" to "0", then to "1" is extremely rapid, the user simply has the impression that the content of display unit 14 remains at "1".

If it is required to obtain a plurality of copies of a document, the setting switch 16 is actuated a requisite number of times prior to actuation of the photocopying machine. Supposing, for example, that three copies of the document are required, since the content of counter 13 and display unit 14 is already "1" the control panel push-button controlling switch 16 is depressed and released twice, to cause supply of two rising edge inputs to count-up terminal 13U of counter 13, whereby the content of counter 13 is incremented by decimal "2", the voltage level at counter output terminals 13a, 13b, 13c, and 13d now being "H", "H", and "L", and "L", respectively, and display unit 14 showing the figure "3".

If a larger number of copies of the same document is required, it is not of course necessary for a user to count the number of times the push-button controlling switch 16 is actuated, since the content of the display unit 14 is increased by "1" each time this push-button is actuated, and it is therefore simply necessary to observe the content of display unit 14.

Since the output from counter output terminal 13b is now "H", the input supplied by NAND gate 7 to terminal 5a of NAND gate 5 in the actuation circuit is "H". The start switch 17 is now actuated to start photocopying machine action. During this action, the document carrier temporarily opens switch 21, whereby transistor 28 is enabled to conduct and the power supply circuit to the photocopying machine actuation circuit is kept closed, despite the fact that start switch 17 is re-opened, and the photocopying machine will be actuated to obtain a further copy. While the first copy is being obtained the document carrier temporarily actuates switch 20, resulting in input to count-down terminal 13D to reduce the content of counter 13 by 37 1", the voltage level at counter output terminals 13a, 13b, 13c, and 13d thus becoming "L", "H", "L", and "L", respectively, and display unit 14 showing the figure "2". Since the output from output terminal 13b is "H", the output from inverter 10 is "L", the output from NAND gate 7 is "H", and while the second copy is being obtained, due to the opening of switch 21, transistor 28 is again made conductive thus causing permitting actuation of the photocopying machine to be maintained in order to obtain a subsequent copy. Switch 20 also is actuated while the second copy is being obtained- thus resulting in reduction of the content of counter 13 by "1", the output from output terminals 13a, 13b, 13c, and 13d now being "H", "L", "L", and "L" respectively, and display unit 14 therefore showing the value "1".

The output from all output terminals 13b, 13c, and 13d being "L", the input to all input terminals of NAND gate 7 is "H", NAND gate 7 output is therefore "L", and transistor 28 cannot be made conductive while the third copy is being obtained. The power supply circuit to the actuation circuit including relay means 18 is therefore opened when the third copy has been obtained and the photocopying machine remains unactuated until the start switch 17 is subsequently actuated by the user. Actuation of switch 20 while the third copy is being obtained causes the content of counter 13 to be reduced by "1" and become "0", the output from all counter output terminals thus becoming "L", and display unit 14 showing "0". However, as described above, a content of "0" in counter 13 results immediately in a "L" to load terminal 13Lo, and since the input to both input terminals of NAND gate 2 is "H" at this time, the input to reset terminal 13R supplied from NAND gate 2 is also "L", and the coincidence of "L" input at terminals 13Lo and 13R results in the content of counter 13 being incremented by "1", the output at output terminals 13a, 13b, 13c, and 13d becoming "H", "L", "L", and "L" respectively, and the input to load terminal 13Lo supplied by NAND gate 6 again becoming "H". Thus the photocopying machine is stopped and the display unit 14 shows "1". Therefore in order to obtain a copy or copies of another document, all that a user is required to do is to actuate start switch 17 or first specify the number of copies required by actuation of setting switch 16 then actuate start switch 17.

If, during continuous actuation of the photocopying machine in order to obtain a plurality of copies of a document, it is required to stop the photocopying machine, this is simply effected by actuation of reset switch 15. It is supposed, by way of example, that it is wished to stop photocopying machine action when counter 13 and the content of display unit 14 is decimal "5". In this case, output from counter output terminals 13a, 13b, 13c, and 13d is "H", "L", "H", and "L", respectively and the input at load terminal 13Lo and reset terminal 13R is "H" and "L", respectively, the "H" output from output terminal 13c making it possible to render transistor 28 conductive, and hence to cause repeated actuation of the photocopying machine. When now reset switch 15 is actuated the input to terminal 2a of NAND gate 2 becomes "L", and NAND gate 2 therefore supplies a "H" input to reset terminal 13R of counter 13, which results in the content of counter 13 and display unit 14 being momentarily made "0" and immediately after being made "1", as described above. The output from all output terminals now being "L", transistor 28 cannot be subsequently made conductive. However, the state of the photocopying machine actuation circuit in plural-copy action depends on a previous supply of a transistor actuating output from NAND gate 5 as a result of opening of the switch 21 by the document carrier. Power supply to the actuation circuit is therefore maintained until the current copy is obtained, or, if the reset switch 15 is actuated while the document carrier is moving and after switch 21 has been actuated, until the next copy is obtained, after which the power supply circuit is opened and the photocopying machine is stopped, display unit 14 showing "1", and the machine being ready for single- or plural-copy action as before.

The invention thus offers a presettable counter means which permits very simple control of a device, and which, being electronic, has a compact construction. Needless to say, although from the point of view of manufacture it is convenient to have as many identical elements as possible, NAND gate 2 may be replaced by a NOR gate, or other modifications are possible without departure from the principles of the invention. There is therefore no intention of limiting the invention to the exact details shown and described above, and the scope of the invention should be determined by the following claims.

What is claimed is:

1. A presettable counter device for use in a mechanical apparatus comprising:

an electrical power supply to be connected with said apparatus, an up-down counter means coupled to said power supply and able to store numerical information, the content of which counter means is incremented to a predetermined number in order to set operational times for said mechanical apparatus and decremented by "1" for each input signal produced according to the operation of said mechanical apparatus;

a display means coupled to said counter means for indicating the content of said counter means as a decimal representation thereof;

a reset means coupled to said counter means and actuable to set the content of said counter means to "1";

operation start means for starting operation of said mechanical apparatus to initiate decrementation of said numerical information stored in said counter means;

an actuation means coupled to said counter means and said mechanical apparatus for stopping continuous operations of said mechanical apparatus and for setting the content of said counter means to "1" when one cycle of operation has been performed after the content of said counter means becomes "1"; and a set means coupled to said counter means for setting the content of said counter to "1" when said mechanical apparatus is initially connected with said power supply after having been disconnected from the power supply.

2. A presettable counter device for use in photocopying apparatus comprising:

an electrical power supply to be connected with said apparatus, an up-down counter means coupled to said power supply and actuable to count-up and store a predetermined number corresponding to the number of copies of an original to be made in the set operation of said apparatus and to count-down the stored number by "1" for each decrement signal produced according to one copying operation of said apparatus;

a display means coupled to said counter for indicating the content of said counter means as a decimal representation thereof;

a reset means coupled to said counter means and actuable to set the content of said counter means to "1";

operation start means for starting operation of said apparatus to initiate decrementation of said numerical information stored in said counter means;

an actuation means coupled to said counter means and said apparatus for stopping continuous copying operations of said apparatus and for setting the content of said counter means to "1" when one cycle of copying has been performed after the content of said counter means becomes "1"; and a set means coupled to said counter means for setting the content of said counter to "1" when said apparatus is initially connected with said power supply after having been disconnected from the power supply.

3. A presettable counter device as claimed in claim 2, further comprising a switch means coupled to said counter means and actuable to supply said decrement signal during one cycle of the reciprocating movement of a member for scanning the surface of an original paper to be copied.

4. A presettable counter device for use in a mechanical apparatus required to selectively perform an action once or a plurality of times in continuous succession, said action including movement of at least one object during each performance thereof, comprising:

an electrical power supply connectable to said apparatus;

an up-down counter able to store numerical information, having output terminals emitting output indicative of the content of said counter, having an increment input terminal and a decrement input terminal, said counter content being incremented and decremented by "1" for each input signal received at said increment input terminal and said decrement input terminal, respectively, and having a first reset terminal and a second reset terminal, said counter content being reset to "0" upon receipt of an input signal at said first reset terminal and being reset to "1" upon receipt of an input signal at said second reset terminal;

display means coupled to said output terminals of said counter for receiving input therefrom and displaying the content of said counter as a decimal representation thereof;

manually actuable increment input means coupled to said increment input terminal and actuable to supply input signals to said increment input terminal of said counter;

decrement input means coupled to said decrement input terminal and actuable to supply input to said decrement input terminal of said counter, and actuated one time only by said object during each performance of said action by said apparatus;

first reset signal emission means coupled to said first reset terminal and actuable to supply reset input to said first reset terminal of said counter;

first reset control means coupled to said first reset signal emission means and actuable to cause said first reset signal emission means to supply said input to said first reset terminal;

second reset input control means coupled to said second reset terminal and actuable to supply reset input to said second reset terminal of said counter and coupled to the output terminals of said counter for receiving actuating input from said output terminals of said counter, said second reset input control means supplying said reset input to said second reset terminal only when said counter content is "0";

apparatus actuation means coupled to said apparatus and actuable to cause said apparatus to perform said action a required number of times;

apparatus actuation control input means coupled to said output terminals for receiving input from said output terminals of said counter and coupled to said apparatus actuation means for supplying control input to said apparatus actuation means in response to a certain output of said counter, said control input means producing a first control input which is supplied to said apparatus actuation means when said counter content is "1" for causing said apparatus actuation means to cause said apparatus to perform said action one time only, and a second control input which is supplied when said counter content corresponds to a value exceeding "1" and for causing said apparatus actuation means to maintain actuation of said apparatus, whereby said apparatus repeatedly performs said action; and a closable power supply circuit connecting said apparatus actuation means to said power supply.

5. A presettable counter device as claimed in claim 4, wherein said first reset signal emission means is a NAND gate having an output terminal connected to said first reset terminal and two input terminals, and said first reset control means comprises a manually actuable, normally open switch which controls input to one said input terminal of said NAND gate, input being supplied to said terminal only during non-actuation of said switch, and a capacitor which is provided in parallel to said power supply and controls input to the other said input terminal of said NAND gate, input being supplied to other said terminal of said NAND gate when said capacitor is fully charged and there being absence of input to said other input terminal for a time generally equal to the time required to fully charge said capacitor immediately subsequent to connection of said power supply to said presetting counter device.

6. A presettable counter device as claimed in claim 4, wherein said second reset input control means comprises a plurality of inverters, equal in number to said output terminals of said counter, and a multi-input NAND gate, each said inverter having an input terminal individually connected to one output terminal of said counter and an output terminal individually connected to one input terminal of said NAND gate, and said NAND gate having an output terminal connected to said second reset terminal of said counter.

7. A presettable counter device as claimed in claim 4, wherein said apparatus actuation means comprises a self-holding relay means which subsequent to initial energization thereof may independently maintain closure of said closable power supply circuit a sufficient time to permit said apparatus to perform said action one time only, a first power supply circuit closure switch means constituted by a manually actuable, normally open switch which is actuable to cause initial energization of said relay means, and a second power supply circuit closure switch means which is actuable by said second control input from said apparatus actuation input control means and maintains closure of said closable power supply circuit when actuated.

8. A presettable counter device for use in an electrophotographic copying apparatus capable of obtaining one or a plurality of copies from one original to be copied on a copy material movable past various processing stations in sequential cycles of the copying operation, said presetting counter device being preset by an operator to a desired number corresponding to the number of copies to be obtained and counting down the cycles of the copying operation from said desired number until said number is reduced to "1" and stopping said sequential cycles of the copying operation after finishing the final cycle corresponding to said "1", said presetting counter device, being operable by said operator for interrupting said sequential cycles of the copying operation for immediately reducing said number to "1" and stopping said sequential cycles of the copying operation after finishing a final cycle corresponding to said "1", said presetting counter device comprising;

an electrical power supply connectable to said copying apparatus, an up-down counter able to store numerical information corresponding to the numbers of cycles of the copying operation to be carried out by said copying apparatus, said up-down counter having output terminals emitting output indicative of the content of said counter, having an increment input terminal and a decrement input terminal, said counter content being incremented and decremented by "1" for each input signal received at said increment input terminal and said decrement input terminal, respectively, and having a first reset terminal and a second reset terminal, said counter content being reset to "0" upon receipt of an input signal at said first reset terminal and being reset to "1" upon receipt of an input signal at said second reset terminal;

display means coupled to said output terminals of said counter for receiving input therefrom and displaying the content of said counter as a decimal representation thereof;

manually actuable increment input means for presetting said desired number corresponding to the number of copies to be obtained, said manually actuable increment input means being coupled to said increment input terminal and actuable to supply input signals to said increment input terminal of said counter;

decrement input means coupled to said decrement input terminal and actuable to supply input to said decrement input terminal of said counter, and actuated one time only in response to each cycle of the copying operation carried out by said copying apparatus;

first reset signal emission means coupled to said first reset terminal and actuable to supply reset input to said first reset terminal of said counter;

first reset control means coupled to said first reset signal emission means and actuable to cause said first reset signal emission means to supply said input to said first reset terminal;

second reset input control means coupled to said second reset terminal and actuable to supply reset input to said second reset terminal of said counter and coupled to said output terminals of said counter for receiving actuating input from said output terminals of said counter, said second reset input control means supplying said reset input to said second reset terminal only when said counter content is "0";

copying apparatus actuation means coupled to said copying apparatus and actuable to cause said copying apparatus to perform said copying operation for a required number of cycles;

copying apparatus actuation control input means coupled to said output terminals for receiving input from said output terminals of said counter and coupled to said copying apparatus actuation means for supplying control input to said copying apparatus actuation means in response to a certain output of said counter, said control input means producing a first control input which is supplied to said copying apparatus actuation means when said counter content is "1" for causing said copying apparatus actuation means to cause said copying apparatus to perform only one cycle of the copying operation, and a second control input which is supplied when said counter content corresponds to a value exceeding "1" and for causing said copying apparatus actuation means to continue to carry out sequential cycles of said copying operation, whereby said copying apparatus repeatedly performs said cycles of copying operation; and a closable power supply circuit connecting said copying apparatus actuation means to said power supply.

9. A presettable counter device as claimed in claim 8, wherein said first reset signal emission means is a NAND gate having an output terminal connected to said first reset terminal and two input terminals, and said first reset control means comprises a manually actuable, normally open switch which controls input to one said input terminal of said NAND gate, input being supplied to said terminal only during non-actuation of said switch, and a capacitor which is provided in parallel to said power supply and controls input to the other said input terminal of said NAND gate, input being supplied to other said terminal of said NAND gate when said capacitor is fully charged and there being absence of input to said other input terminal for a time generally equal to the time required to fully charge said capacitor immediately subsequent to connection of said power supply to said presetting counter device.

10. A presettable counter device as claimed in claim 8, wherein said second reset input control means comprises a plurality of inverters, equal in number to said output terminals of said counter, and a multi-input NAND gate, each of said inverter having an input terminal individually connected to an output terminal of said counter and an output terminal individually connected to one input terminal of said NAND gate, and said NAND gate having an output terminal connected to said second reset terminal of said counter.

11. A presettable counter device as claimed in claim 8, wherein said copying apparatus actuation means comprises a self-holding relay means which subsequent to initial energization thereof may independently maintain closure of said closable power supply circuit a sufficient time to permit said copying apparatus to perform only one cycle of copying operation, a first power supply circuit closure switch means constituted by a manually actuable, normally open switch which is actuable to cause initial energization of said relay means, and a second power supply circuit closure switch means which is actuable by said second control input from said copying apparatus actuation input control means and maintains closure of said closable power supply circuit when actuated.

12. A presettable counter device as claimed in claim 11, wherein said second power supply circuit closure means comprises a transistor which is provided between said relay means and a portion of said power supply circuit connected to one terminal of said power supply and which when actuated and rendered conductive maintains closure of said power supply circuit;

- a transistor control NAND gate having a single output terminal, a first input terminal to which input is supplied from said copying apparatus actuation control means and a second input terminal;
- a normally closed switch which is actuated once by said copy material as it moves past said normally closed switch each time said copying apparatus performs said cycle of the copying operation and controls input to said second input terminal of said transistor control NAND gate, input to said second input terminal of said transistor control NAND gate being supplied only when said switch is actuated;
- an inverter having an input terminal connected to the output terminal of said transistor control NAND gate and an output terminal connected to and able to supply actuating input to said transistor; and
- said copying apparatus actuation control means comprises a plurality of inverters having input terminals individually connected to those output terminals of said counter which carry output representative of a counter content greater than "1", and a NAND gate which has a signal output terminal connected to said first input terminal of said transistor control NAND gate and has a plurality of input terminals, individually connected to the output terminals of said inverters connected to said counter output terminals.

* * * * *